US007005584B2

(12) United States Patent
Levi et al.

(10) Patent No.: US 7,005,584 B2
(45) Date of Patent: Feb. 28, 2006

(54) COMPACT NAVIGATION DEVICE ASSEMBLY

(75) Inventors: Robert W. Levi, Fountain Valley, CA (US); Ron Fang, Fountain Valley, CA (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 10/778,626

(22) Filed: Feb. 13, 2004

(65) Prior Publication Data

US 2005/0180120 A1   Aug. 18, 2005

(51) Int. Cl.
*H05K 1/14* (2006.01)
*H05K 3/36* (2006.01)
(52) U.S. Cl. .................. 174/254; 361/749; 29/835; 228/179.1
(58) Field of Classification Search ............... 361/752, 361/729, 736, 749, 750, 748, 760, 790, 746, 361/751, 796, 784; 174/250, 254, 255; 29/831, 29/830, 835, 844, 846; 228/179.1
See application file for complete search history.

(56) References Cited

U.S. PATENT DOCUMENTS

| 2,279,864 | A |   | 4/1942 | Eide |
| 2,816,253 | A |   | 12/1957 | Blitz |
| 2,850,681 | A |   | 9/1958 | Horton |
| 2,995,686 | A |   | 8/1961 | Selvin |
| 3,066,436 | A |   | 12/1962 | Schuh |
| 3,087,096 | A |   | 4/1963 | Jorgensen |
| 3,330,695 | A | * | 7/1967 | Curran ............... 427/97 |
| 3,379,315 | A |   | 4/1968 | Broadwin |
| 3,522,485 | A |   | 8/1970 | DeMetrick |
| 3,614,541 | A |   | 10/1971 | Farrand |
| 3,780,431 | A | * | 12/1973 | Feeney ............... 29/830 |
| 3,855,748 | A |   | 12/1974 | Thomas |
| 3,949,274 | A |   | 4/1976 | Anacker |
| 4,059,849 | A | * | 11/1977 | Mitchell ............... 361/743 |
| 4,335,272 | A | * | 6/1982 | Pittenger ............... 174/254 |
| 4,513,064 | A | * | 4/1985 | Marcus ............... 428/582 |
| 4,672,252 | A | * | 6/1987 | Spirk ............... 310/216 |
| 4,677,252 | A | * | 6/1987 | Takahashi et al. ....... 174/254 |
| 4,742,183 | A | * | 5/1988 | Soloway et al. .......... 174/254 |
| 4,770,640 | A |   | 9/1988 | Walter |
| 4,823,233 | A |   | 4/1989 | Brown et al. |
| 4,991,291 | A | * | 2/1991 | Koepke et al. ............... 29/884 |
| 5,031,027 | A | * | 7/1991 | Dorinski et al. ........... 257/660 |
| 5,140,745 | A |   | 8/1992 | McKenzie, Jr. |
| 5,170,328 | A | * | 12/1992 | Kruppa ............... 361/749 |
| 5,224,023 | A | * | 6/1993 | Smith et al. ............... 361/784 |
| 5,257,718 | A | * | 11/1993 | Chiu ............... 228/179.1 |
| 5,514,907 | A |   | 5/1996 | Moshayedi |
| 5,581,877 | A |   | 12/1996 | Woychik et al. |
| 5,629,839 | A |   | 5/1997 | Woychik |
| 5,754,411 | A |   | 5/1998 | Woychik |

(Continued)

*Primary Examiner*—Randy W. Gibson
*Assistant Examiner*—Dameon E. Levi
(74) *Attorney, Agent, or Firm*—Julio M. Loza; Sheldon & Mak (57) ABSTRACT

One embodiment of the invention provides a compact navigation device assembly that is rugged, compact and does not require independent connector components to interconnect multiple circuit boards. According to one implementation of the compact navigation device assembly, an electrical or electromechanical circuit may be laid-out among a plurality of circuit boards that are electrically joined along their edges in a three-dimensional structure without the use of discrete connectors or components. Each circuit board may have one or more crenelated, serrated, and/or notched edge to electrically join the circuit board to other circuit boards. Such crenelated edges may be plated for electrical conductivity and may be joined to corresponding crenelated edges with solder or other electrically conductive materials.

4 Claims, 8 Drawing Sheets

U.S. PATENT DOCUMENTS

| | | | |
|---|---|---|---|
| 5,917,149 A * | 6/1999 | Barcley et al. | 174/35 C |
| 6,075,708 A * | 6/2000 | Nakamura | 361/752 |
| RE36,916 E | 10/2000 | Moshayedi | |
| 6,378,757 B1 | 4/2002 | Holcombe et al. | |
| 6,395,992 B1 * | 5/2002 | Nakayama et al. | 174/254 |
| 6,410,859 B1 | 6/2002 | King | |
| 6,418,030 B1 | 7/2002 | Yamaguchi et al. | |
| 6,483,713 B1 * | 11/2002 | Samant et al. | 361/749 |
| 6,496,384 B1 | 12/2002 | Morales et al. | |
| 6,594,152 B1 * | 7/2003 | Dent | 361/785 |
| 6,665,191 B1 * | 12/2003 | Blood et al. | 361/749 |
| 6,668,447 B1 * | 12/2003 | Samant et al. | 29/830 |

* cited by examiner

COMPACT NAVIGATION DEVICE ASSEMBLY

FIELD OF THE INVENTION

One embodiment of the invention relates generally to navigation devices and circuit board assemblies. In particular, where implementation of the invention provides a method or arrangement for creating compact three-dimensional navigation device assemblies.

DESCRIPTION OF RELATED ART

Circuit boards have been used in the art for many years. In recent years, it has become increasingly important to reduce the size of electronic devices as electronic devices become more compact. In doing so, many different techniques have been employed to assemble circuit boards within increasingly smaller spaces. One technique provides for stacking circuit boards on top of each other and connecting them using connector components that are soldered or coupled between boards. One disadvantage of using such connector components is that they increase the cost of manufacturing such circuit board assemblies as well as reducing the space available for mounting components and running traces due to the required interconnect devices. In many applications, such as positioning systems and navigation devices, it is also important for the circuit board assembly to be rugged so that it may withstand shock in harsh environmental conditions. Conventional circuit boards tend to be rigid and thin, thus making them susceptible to breaking or cracking under harsh treatment or environmental conditions.

DETAILED DESCRIPTION

In the following description numerous specific details are set forth in order to provide a thorough understanding of the invention. However, one skilled in the art would recognize that the invention may be practiced without these specific details. In other instances, well known methods, procedures, and/or components have not been described in detail so as not to unnecessarily obscure aspects of the invention.

In the following description, certain terminology is used to describe certain features of one or more embodiments of the invention. For instance, "navigation device" includes any mobile device used for relative or absolute position determination or estimation, such as global positioning, terrestrial positioning, maritime positioning, accelerometer assemblies, compass assemblies, guidance devices, etc. The term "circuit board" includes any surface on which one or more electric, mechanical, or electromechanical components may be mounted. The terms "crenelated" and/or "castellated", e.g., crenelated edge, are used interchangeably with, and to describe notched, serrated, crenulated and/or similar types of formations along an edge. The term "edge-joint interface", e.g., crenelated edge-joint interface, refers to any electrically conductive interface along the side-edge of a circuit board. The term "three-dimensional circuit board assembly" refers to an assembly of a plurality of circuit boards in which at least one circuit board is positioned at non-coplanar angle to one other circuit board.

One embodiment of the invention provides a three-dimensional circuit board assembly that is rugged, compact and does not require independent connector components to interconnect the multiple circuit boards. According to one implementation of the three-dimensional circuit board assembly, a navigation device, including an electrical or electro-mechanical circuit, may be laid-out among a plurality of circuit boards that are electrically joined along their edges in a three-dimensional structure without the use of discrete connectors or components. Each circuit board may have one or more edge-joint interfaces (e.g., crenelated, serrated, and/or notched edges) to electrically join the circuit board to other circuit boards. Such edge-joint interfaces (e.g., crenelated edges) may be plated for electrical conductivity and may be joined to corresponding edge-joint interfaces (e.g., crenelated edges) on other circuit boards with solder or other electrically conductive materials.

Figure 1:
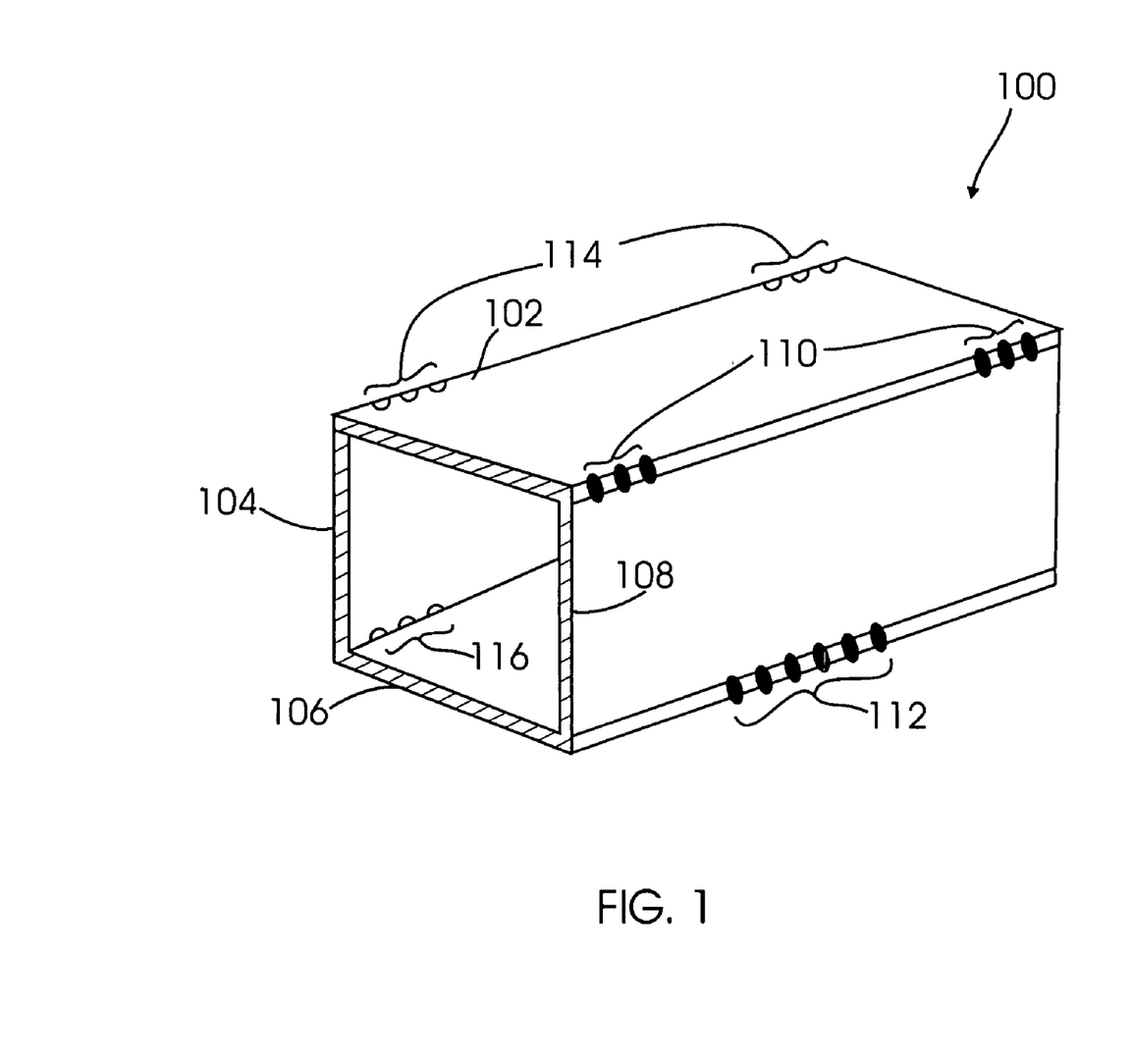
FIG. 1 illustrates a compact three-dimensional navigation device assembly joined along edge-joint interfaces according to one embodiment of the invention.

FIG. 1 illustrates a compact three-dimensional navigation device assembly 100 joined along edge-joint interfaces (e.g., crenelated edges) according to one embodiment of the invention. The navigation device assembly 100 includes a plurality of circuit boards 102, 104, 106, and 108 coupled together along the edges of the circuit board using solder joints 110, 112, 114, and 116 to create a three-dimensional circuit board assembly. The navigation device assembly 100 permits arranging or folding-over a circuit board into a compact or small size while maintaining electrical conductivity between components mounted thereon.

One implementation of the invention provides circuit boards with unique edge-joint interfaces, such as castellated, crenellated, crenulated, notched, and/or serrated edges, instead of a conventional right-angle electrical connector, to transfer electrical signals between circuit boards. This method provides a rugged means for connecting two or more circuit boards at an angle to each other (e.g., ninety degrees or any other angle) without the use of a separate connector component or mechanical standoffs to provide structural support. In addition, this configuration can be further strengthened by encapsulation or potting the assembly in a plastic material such as epoxy. The advantages provided by this method are that space in the circuit board is not used by a connector component as in conventional assemblies so that a joint interface can be made at the edge of the circuit board assembly. The electrical interface is part of the circuit board itself. Separate connection components are not needed, thus reducing parts count, saving costs and improving reliability.

Figure 2:
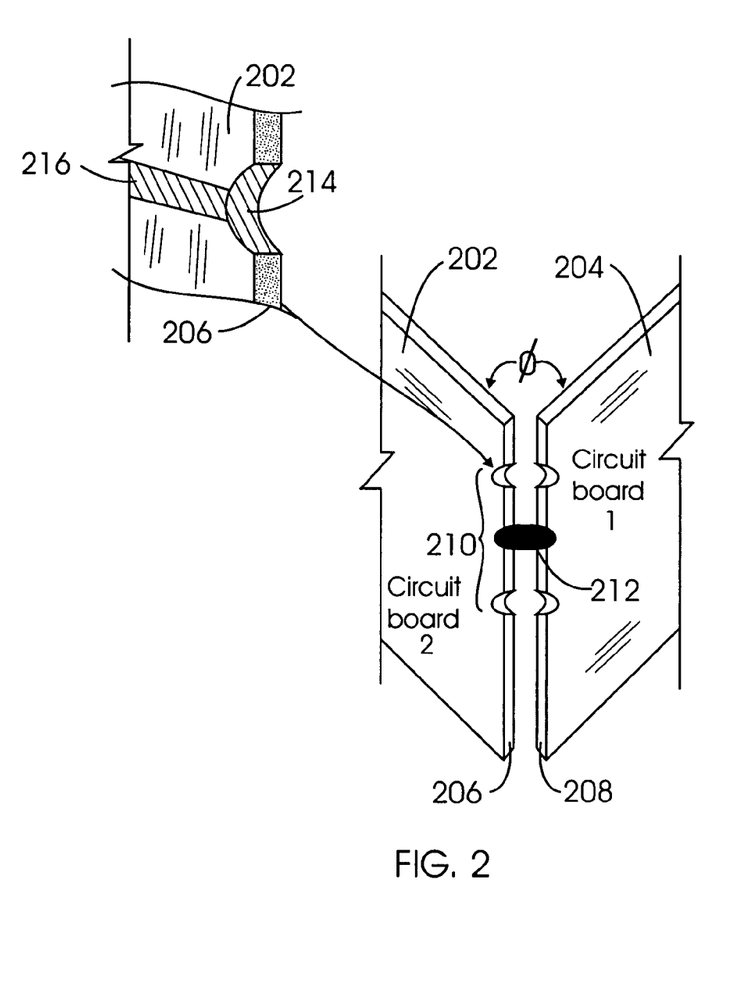
FIG. 2 illustrates two circuit boards joined along crenelated edges and at an angle to each other according to one embodiment of the invention.

FIG. 2 illustrates two circuit boards 202 and 204 joined along crenellated edges 206 and 208 and positioned at an angle θ to each other according to one embodiment of the invention. In one implementation of the invention, a crenellated, notched, and/or serrated edge 206 may be formed by half-holes electrical interfaces 210 along the edge of a circuit board 202 to create one or more edge-joint interfaces. The half-holes 210 may be plated 214, with an electrically conductive material, and coupled to one or more electrical traces 216 on the circuit board 202. In one implementation of the invention, the half-holes 210 are plated with a thin layer of electrically conductive material. In another implementation, the half-holes 210 are filled with an electrically conductive material. Such plating 214 permits electrically coupling a first half-hole electrical interface on a first circuit board to a second half-hole electrical interface on a second circuit board. The circuit boards 202 and 204 may be held together at an angle θ so that a solder meniscuses or joints 212 can be formed at each electrical interface connection.

Figure 3:
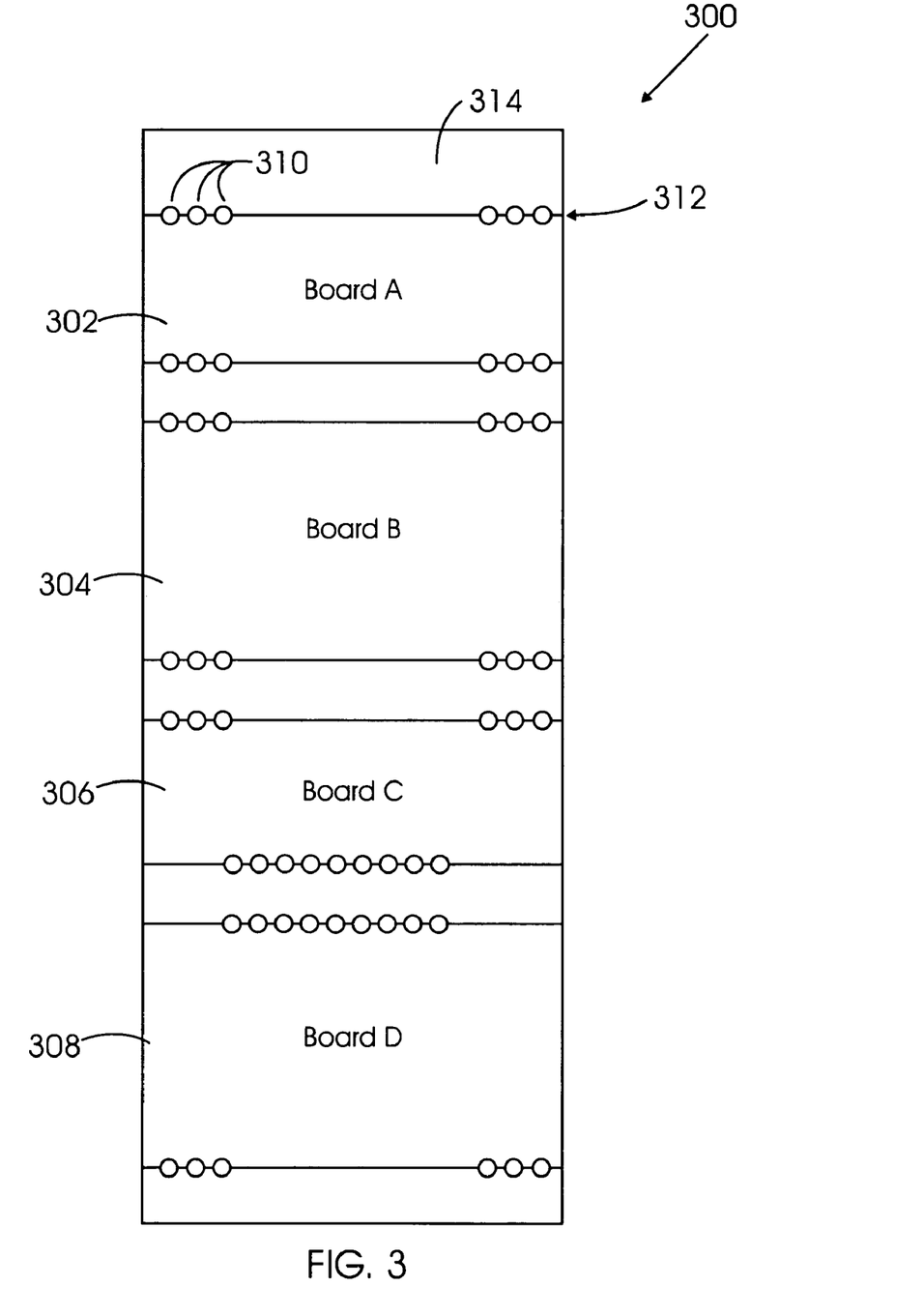
FIG. 3 is a circuit board illustrating how the edge-joint interfaces of a three-dimensional circuit board assembly may be created according to one embodiment of the invention.

FIG. 3 is a circuit board 300 illustrating how the edge-joint interfaces of a three-dimensional circuit board assembly may be created according to one embodiment of the invention. The edge-joint interfaces 310, such as crenulated edge joints, may be fabricated by laying out the printed circuit boards 302, 304, 306, and 308 in a manner similar to creating connection holes for conventional through hole connections. However, the hole patterns 310 are offset so that the edge of the circuit board falls approximately on the center line 312 of the fold pattern. For example, in creating a crenulated edge for Board A 302, holes 310 are drilled along the edge of Board A 310 and then the board is cut along a cut line 312 or machined such that the excess piece 314 is cut or separated from Board A 302. The same technique may be used to create other edge-joint interfaces, e.g., crenellated edges, along the remaining circuit board pieces 304, 306, and 308 in order to create the boards with the appropriate crenellated edges according to one embodiment of the invention.

Figure 4:
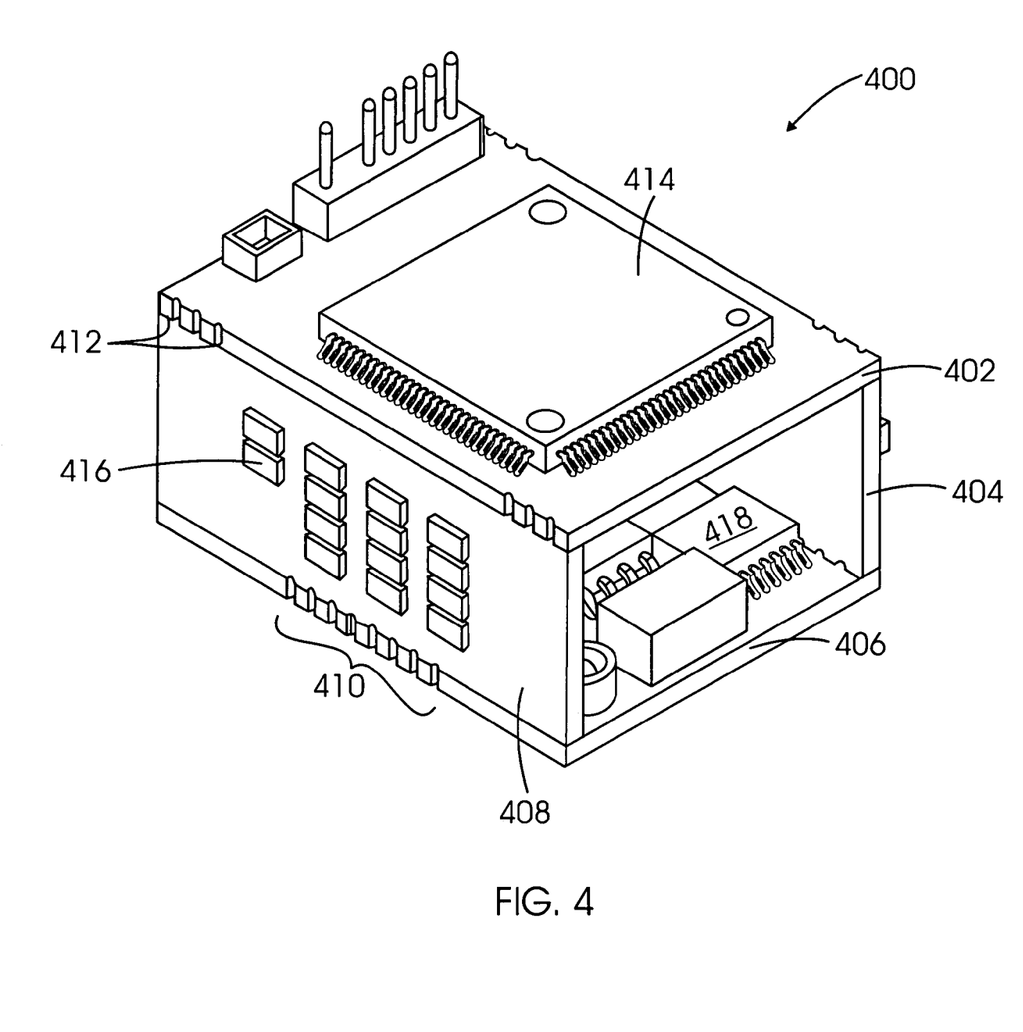
FIG. 4 illustrates a three-dimensional circuit board assembly including multiple components mounted thereon according to one implementation of the invention.

FIG. 4 illustrates a three-dimensional circuit board assembly 400 including multiple components mounted thereon according to one implementation of the invention. The three-dimensional circuit board assembly may include circuit boards 402, 404, 406, and 408 arranged as a three-dimensional structure. The circuit boards 402, 404, 406, and 408 may include edge-joint interfaces 410 and 412 to couple the boards together along the edges. Each edge-joint interface, e.g., crenellated edge, on a circuit board may include plated joints electrically coupled to one or more components on the circuit board. When an electrically conductive material (e.g., solder) is placed between the two plated joints of two or more circuit boards, the circuit boards can be electrically coupled. In this manner, a plurality of electrical or electromechanical components 414 and 416 on different circuit boards may be electrically coupled to each other.

According to one implementation of the invention, the circuit boards may have components mounted on both sides of the circuit boards. For example, component 418 may be mounted in the interior portion of the three-dimensional assembly on circuit board 406. Components mounted on the interior of the assembly may also be electrically coupled to the edge-joint interfaces 410 and 412 along the edge of their respective circuit board so that the various components on the circuit board may have electrical conductivity.

Figure 5:
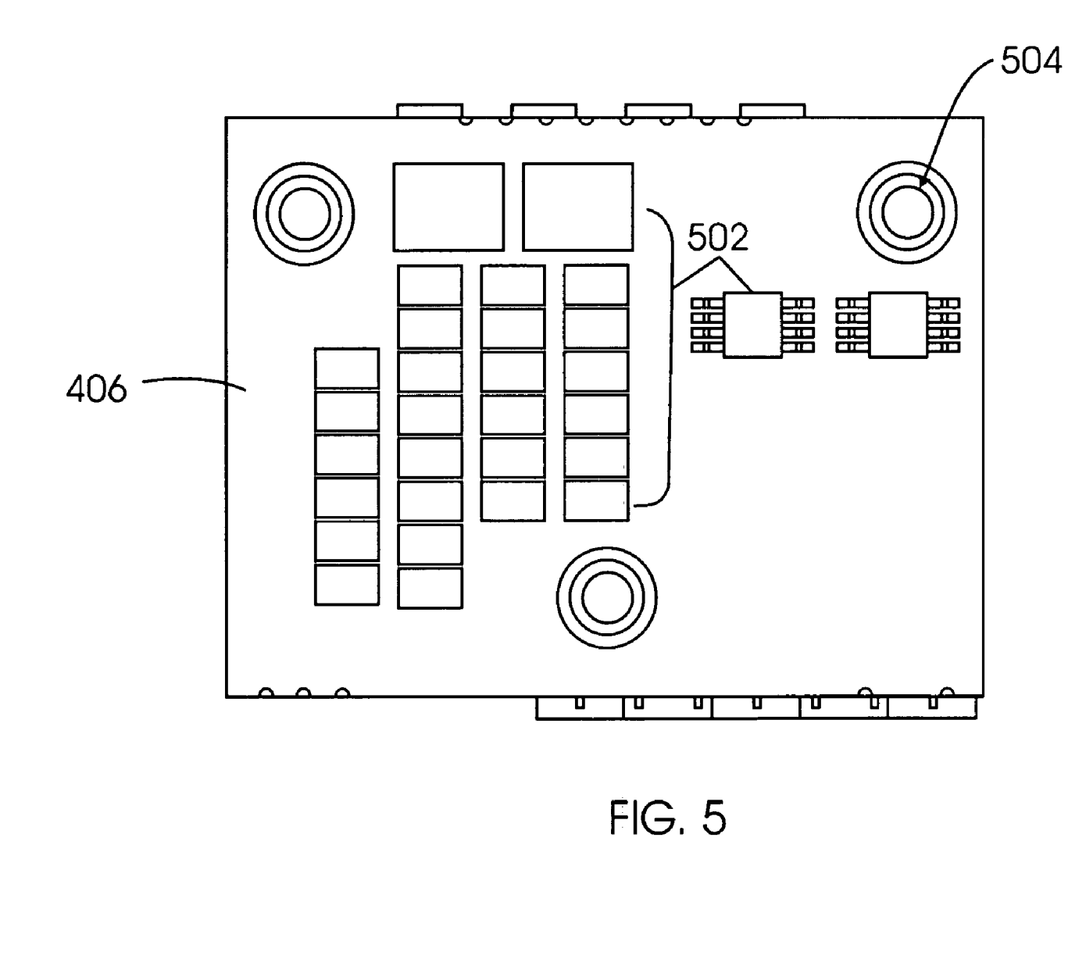
FIG. 5 is a face view of a circuit board which is part of a circuit board assembly according to one implementation of the invention.

FIG. 5 is a face view of a circuit board 406 which is part of a circuit board assembly according to one implementation of the invention. The board includes a plurality of electronic components 502 and three mounting or securing points 504. These mounting points 504 may be used to attach or couple the board to another surface or device. In various embodiments of the invention, fasteners, screws or other mechanisms may be used to attach the circuit board assembly to another device or component.

In one implementation of the invention, the circuit board may have compact dimensions. For instance, the circuit board may be approximately one inch wide by 0.8 inches long.

Figure 6:
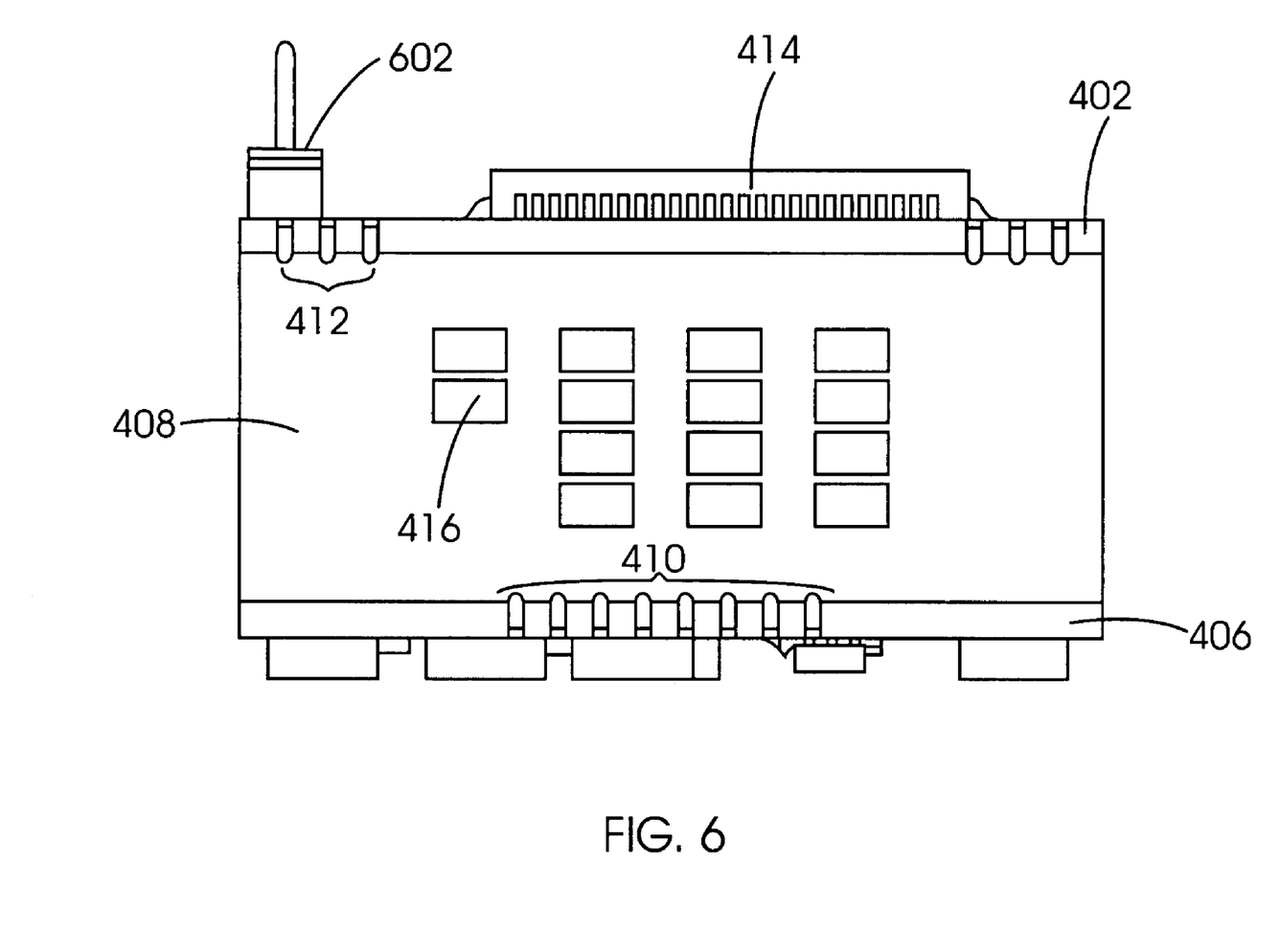
FIG. 6 illustrates the face view of a circuit board, and electrical components mounted thereon, which is part of a compact three-dimensional navigation device assembly according to one embodiment of the invention.

FIG. 6 illustrates the face view of a circuit board 408, with electrical components mounted thereon, which is part of a compact three-dimensional navigation device assembly according to one embodiment of the invention. This view illustrates the edge-joint interfaces 410 and 410 (e.g., edge-joint interface) that are used to electrically couple components from one circuit board to another circuit board. The navigation device assembly may have a compact profile so that it fits within a 0.6-inch high enclosure. A connector 602 may serve as an input/output interface point for the three-dimensional navigation device assembly. Said connector may carry signals to and from the navigation device assembly.

Figure 7:
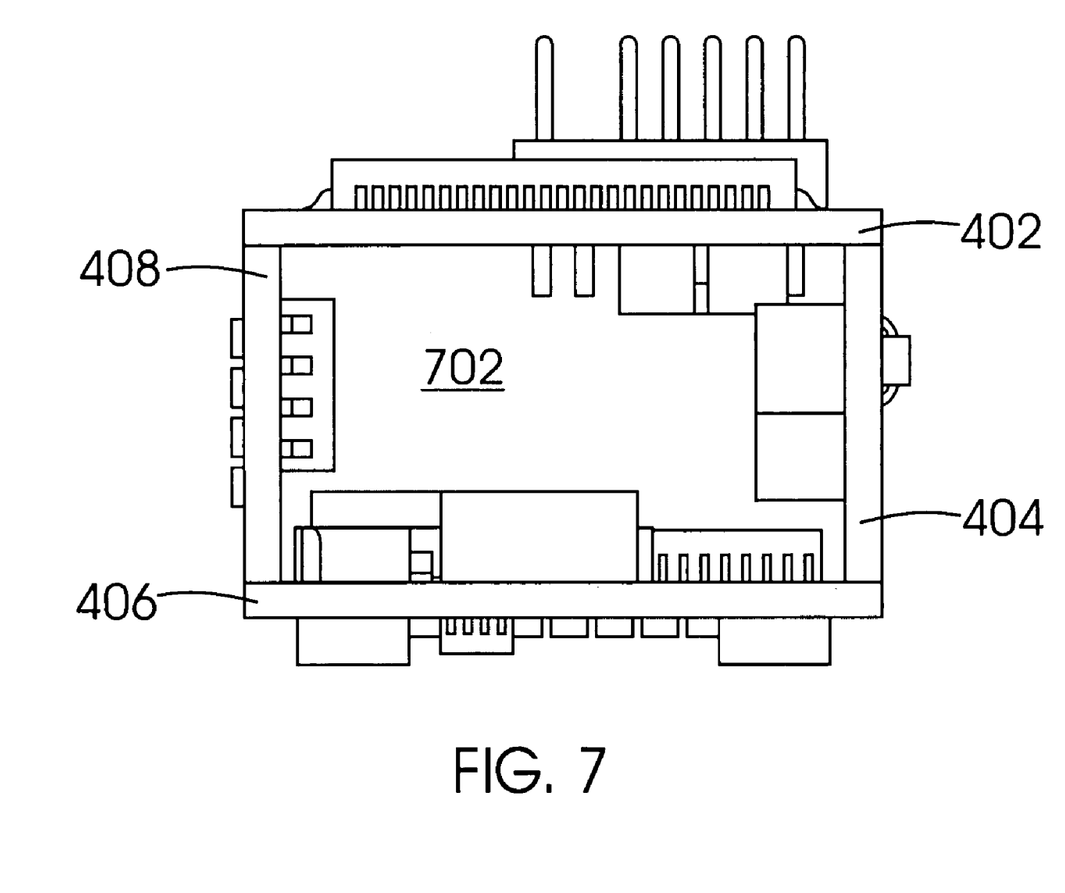
FIG. 7 illustrates an end view of a three-dimensional navigation device assembly according to one embodiment of the invention.

FIG. 7 illustrates an end view of a three-dimensional navigation device assembly according to one embodiment of the invention. This view shows the arrangement of the four circuit boards 402, 404, 406, and 408, and a cavity 702 that is defined by the circuit boards. As illustrated in this figure, a plurality of electrical or electromechanical components may be mounted on the internal surfaces of the circuit boards 402, 404, 406, and 408, within the cavity defined by the circuit boards. The open-ended cavity design facilitates encapsulation by providing a convenient reservoir for filling the potting material.

Figure 8:
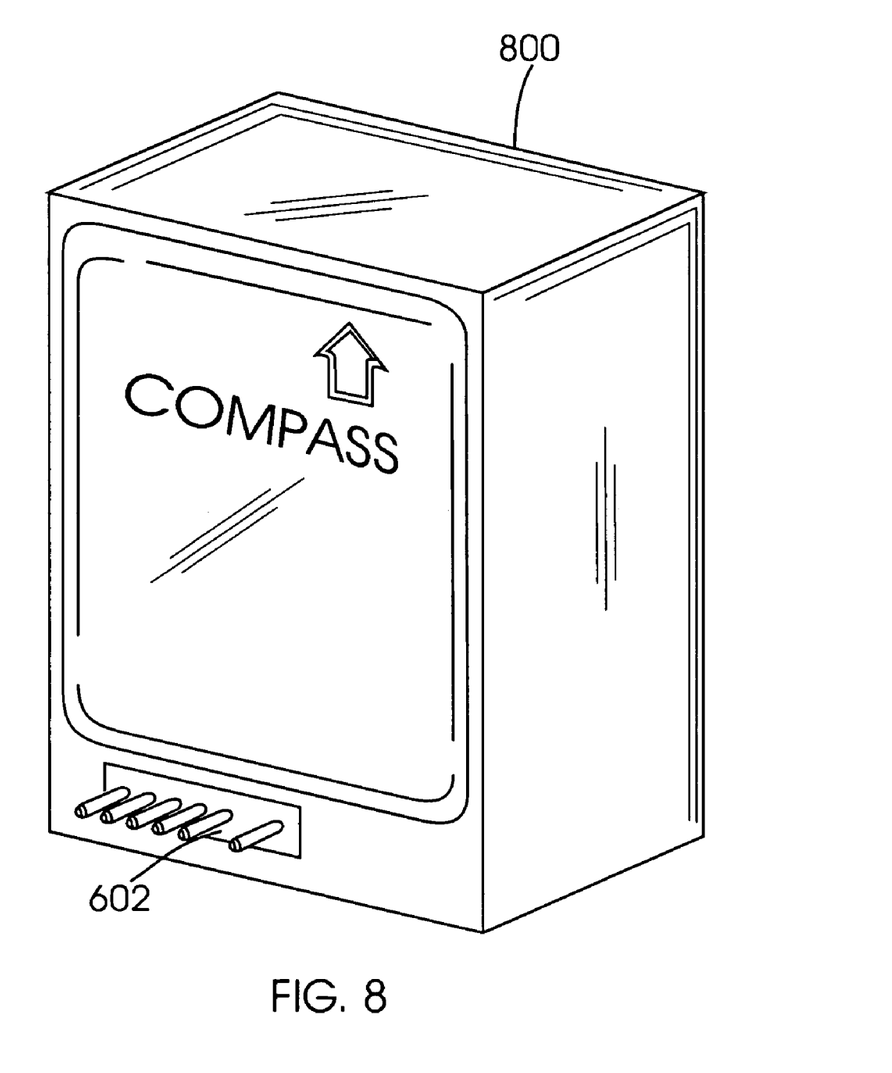
FIG. 8 illustrates a three-dimensional navigation device assembly encased in a thermally conductive epoxy according to one embodiment of the invention.

FIG. 8 illustrates the three-dimensional navigation device assembly 800, such as the assembly in FIG. 4, encased in a thermally conductive epoxy according to one embodiment of the invention. By encasing the three-dimensional circuit board assembly in epoxy, this provides greater strength to the three-dimensional circuit board assembly 800. This may be useful for rugged applications where the circuit board assembly 800 may be exposed to significant impact and/or harsh environmental conditions. The connector 602 provides electrical conductivity to the components inside the encased three-dimensional circuit board system.

According to another feature of the invention, a plurality of three-dimensional assemblies may be cascaded in various configurations (e.g., side-by-side, end-to-end, etc.) as well as electrically interconnected. For instance, a particular circuit module may be formed of various assemblies or modules that may then be electrically and/or physically coupled together, depending on required features or end application.

According to another aspect of the invention, circuit boards with edge-joint interfaces may be formed in shapes other than those shown in FIGS. 1 and 4, for instance. According to various implementations, a plurality of circuit boards with edge-joint interfaces may be arranged in a pentagonal configuration, octagonal configuration, or any other multi-board configuration to form an electrically conductive circuit. Additionally, the circuit boards with edge-joint interfaces may be joined at any angle, including coplanar and/or ninety degrees to each other.

According to various embodiments of the invention, the circuit boards may be rectangular (as illustrated in FIG. 3) or any other arbitrary shape. By using non-rectangular circuit boards, the three-dimensional assembly formed may be shaped as a pyramid or any other configuration.

According to one implementation of the invention, the three-dimensional navigation device assembly may serve to house a plurality of accelerometers for electronic compass, positioning systems, and/or guidance applications. That is, the three-dimensional navigation device assembly may have miniature accelerometers mounted on the various circuit board walls to provide acceleration measurements along three different axes. For example, a first accelerometer may be mounted on the circuit board 402 (FIG. 4). A second accelerometer may be mounted on circuit board 406. A third accelerometer measuring the z-axis, for instance, may be mounted on any of the boards. The three-dimensional circuit board and accelerometers may be calibrated to provide for any skew in the mounting of the circuit boards relative to each other.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications are possible. Those skilled, in the art will appreciate that various adaptations and modifications of the just described preferred embodiment can be configured without departing from the scope and spirit of the invention. For instance, while a compact three-dimensional navigation device assembly is illustrated in many of the embodiments described herein, one or more aspects of the invention may be practiced in general on circuit board assemblies having other applications, without departing from the invention. Therefore, it is to be understood that, within the scope of the appended claims, the invention may be practiced other than as specifically described herein.

What is claimed is:

1. A method for constructing an electronic module comprising:
    forming an electrical circuit layout on a main substrate, the electrical circuit including a plurality of electrically conductive circuit traces;
    perforating the one or more electrically conductive circuit traces along defined lines on the main substrate;
    depositing an electrically conductive material along the walls of the one or more perforations, the electrically conductive material being electrically coupled to one or more of the circuit traces;
    dividing the main substrate into a plurality of substrates along the perforated defined lines, the plurality of sectional substrates having corresponding edge-joint interfaces at the walls of the perforations;
    electrically coupling a first sectional substrate to a second sectional substrate along their corresponding edge-joint interfaces;
    electrically coupling the second sectional substrate to a third sectional substrate along their corresponding edge-joint interfaces;
    electrically coupling the third sectional substrate to a fourth sectional substrate along their corresponding edge-joint interfaces; and
    electrically coupling the fourth sectional substrate to the first sectional substrate along their corresponding edge-joint interfaces.

2. The method of claim 1 wherein electrically coupling the first, second, third, and fourth sectional substrates forms the electrical circuit layout on the main substrate.

3. The method of claim 1 further comprising:
    coupling electrical components to the circuit traces prior to coupling the first, second, third, and fourth sectional substrates together.

4. The method of claim 1 further comprising:
    encasing the electronic module in a thermally conductive material to provide protection against environmental conditions.

\* \* \* \* \*